United States Patent
Kang et al.

(10) Patent No.: US 12,471,268 B2
(45) Date of Patent: Nov. 11, 2025

(54) SEMICONDUCTOR DEVICE AND METHOD OF MANUFACTURING THE SAME

(71) Applicant: Samsung Electronics Co., Ltd., Suwon-si (KR)

(72) Inventors: Jungoo Kang, Suwon-si (KR); Jinsu Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 507 days.

(21) Appl. No.: 17/960,578

(22) Filed: Oct. 5, 2022

(65) Prior Publication Data

US 2023/0292489 A1 Sep. 14, 2023

(30) Foreign Application Priority Data

Mar. 14, 2022 (KR) .................. 10-2022-0031650

(51) Int. Cl.
*H10B 12/00* (2023.01)
(52) U.S. Cl.
CPC ......... *H10B 12/315* (2023.02); *H10B 12/033* (2023.02)
(58) Field of Classification Search
None
See application file for complete search history.

(56) References Cited

U.S. PATENT DOCUMENTS

| | | | |
|---|---|---|---|
| 8,614,498 B2 * | 12/2013 | Park | H10D 1/716 257/532 |
| 9,236,427 B2 | 1/2016 | Greeley et al. | |
| 9,362,422 B2 | 6/2016 | Lim | |
| 9,773,861 B2 | 9/2017 | Lee et al. | |
| 10,355,073 B2 | 7/2019 | Lee et al. | |
| 10,825,893 B2 | 11/2020 | Cho et al. | |
| 10,978,552 B2 | 4/2021 | Kang et al. | |
| 11,031,460 B2 | 6/2021 | Kang et al. | |
| 11,088,240 B2 | 8/2021 | Kim et al. | |
| 11,812,601 B2 | 11/2023 | Kang et al. | |

(Continued)

FOREIGN PATENT DOCUMENTS

| | | |
|---|---|---|
| KR | 10-2009-0111018 A | 10/2009 |
| KR | 100951557 B1 | 4/2010 |
| TW | 202205629 A | 2/2022 |

OTHER PUBLICATIONS

Office Action issued Oct. 4, 2023 in Taiwanese Application No. 112104813.

(Continued)

*Primary Examiner* — Steven M Page
(74) *Attorney, Agent, or Firm* — Harness, Dickey & Pierce, P.L.C.

(57) ABSTRACT

Provided is a semiconductor device. The semiconductor device includes a lower structure; a lower electrode on the lower structure; a dielectric layer on the lower electrode; and an upper electrode on the dielectric layer, wherein the lower electrode includes a bending reducing layer and a dielectric constant-increasing layer between the bending reducing layer and the dielectric layer, the dielectric constant-increasing layer is configured to increase a dielectric constant of the dielectric layer, and an elastic modulus of the bending reducing layer is greater than an elastic modulus of the dielectric constant-increasing layer.

20 Claims, 20 Drawing Sheets

(56) References Cited

U.S. PATENT DOCUMENTS

| | | |
|---|---|---|
| 2012/0098132 A1 | 4/2012 | Park et al. |
| 2019/0267383 A1 | 8/2019 | Rocklein et al. |
| 2020/0266265 A1* | 8/2020 | Kang .................. H10B 12/033 |
| 2020/0273867 A1 | 8/2020 | Manipatruni et al. |
| 2020/0395438 A1 | 12/2020 | Kang et al. |
| 2021/0118980 A1 | 4/2021 | Park et al. |
| 2021/0125996 A1 | 4/2021 | An et al. |
| 2021/0159310 A1 | 5/2021 | Lee et al. |
| 2021/0273041 A1 | 9/2021 | Kang et al. |

OTHER PUBLICATIONS

Partial European Search Report issued Aug. 2, 2023 in EP Patent Application No. 22206369.5.

* cited by examiner

SEMICONDUCTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0031650, filed on Mar. 14, 2022, in the Korean Intellectual Property Office, the disclosure of which is incorporated by reference herein in its entirety.

BACKGROUND

The inventive concepts relate to a semiconductor device and a method of manufacturing the same, and more particularly, to a semiconductor device including a capacitor and a method of manufacturing the same.

As the demand for electronic products to be down-scaled increases, demand for improvements in the degree of integration of semiconductor devices is also increasing. Therefore, semiconductor devices including capacitors having higher capacitance while occupying smaller areas are demanded. For example, in order to implement a capacitor having higher capacitance while occupying a smaller planar area, the aspect ratio of a lower electrode of the capacitor may be increased. However, as the aspect ratio of the lower electrode increases, bending of the lower electrode may increase.

SUMMARY

The inventive concepts provide a semiconductor device including a capacitor having higher capacitance by reducing bending of a lower electrode while increasing a dielectric constant of a dielectric layer. The inventive concepts also provide a method of manufacturing such a semiconductor device.

According to an aspect of the inventive concepts, there is provided a semiconductor device including a lower structure; a lower electrode on the lower structure; an upper electrode; and a dielectric layer between the lower electrode and the upper electrode, wherein the lower electrode includes a bending reducing layer and a dielectric constant-increasing layer between the bending reducing layer and the dielectric layer, the dielectric constant-increasing layer is configured to increase a dielectric constant of the dielectric layer, and an elastic modulus of the bending reducing layer is greater than an elastic modulus of the dielectric constant-increasing layer.

According to another aspect of the inventive concepts, there is provided a semiconductor device including a lower structure; a lower electrode comprising a surface layer on the lower structure, a bending reducing layer, and a dielectric constant-increasing layer between the surface layer and the bending reducing layer; a support pattern contacting side surfaces of the lower electrode and supporting the lower electrode; a dielectric layer on the lower electrode and the support pattern; and an upper electrode on the dielectric layer, wherein at least a portion of the dielectric constant-increasing layer is in direct contact with the dielectric layer.

According to another aspect of the inventive concepts, there is provided a semiconductor device including a lower structure; a lower electrode, comprising a surface layer on the lower structure, a dielectric constant-increasing layer on the surface layer, and a bending reducing layer on the dielectric constant-increasing layer, and a dielectric constant-increasing layer between the surface layer and the bending reducing layer; a support pattern contacting side surfaces of the lower electrode and supporting the lower electrode; a dielectric layer on the lower electrode and the support pattern; and an upper electrode on the dielectric layer, wherein the bending reducing layer has a pillar shape extending in a vertical direction, the surface layer includes a first side portion in direct contact with the support pattern and a second side portion in direct contact with the dielectric layer, and a thickness of the second side portion of the surface layer in a horizontal direction perpendicular to the vertical direction is less than a thickness of the first side portion of the surface layer.

According to another aspect of the inventive concepts, there is provided a method of manufacturing a semiconductor device, the method including forming a mold structure on a lower structure; forming a hole exposing the lower structure through the mold structure; forming a lower electrode in the hole; exposing at least a portion of the lower electrode by removing at least a portion of the mold structure; forming a dielectric layer on the exposed lower electrode; and forming an upper electrode on the dielectric layer, wherein the forming of the lower electrode includes forming a surface layer in the hole, forming a dielectric constant-increasing layer on the surface layer in the hole, and forming a bending reducing layer on the dielectric constant-increasing layer in the hole.

According to another aspect of the inventive concepts, there is provided a method of manufacturing a semiconductor device, the method including forming a mold structure including a mold layer on a lower structure and a support layer on the mold layer; forming a mold structure pattern comprising a mold pattern a support pattern on the mold pattern by forming a hole, exposing the lower structure, through the mold structure; forming a lower electrode in the hole by forming, in the hole, a surface layer, a dielectric constant-increasing layer on the surface layer, and a bending reducing layer on the dielectric constant-increasing layer; removing the mold pattern and at least a portion of the surface layer such that a portion of the dielectric constant-increasing layer is exposed after the mold pattern is removed; forming a dielectric layer on the lower electrode and the support pattern; and forming an upper electrode on the dielectric layer.

According to another aspect of the inventive concepts, there is provided a method of manufacturing a semiconductor device, the method including forming a mold structure comprising a mold layer on a lower structure and a support layer on the mold layer; forming a mold structure pattern comprising a mold pattern and a support pattern by forming a hole, exposing the lower structure, in the mold structure; forming a lower electrode in the hole by forming a surface layer in the hole, forming a dielectric constant-increasing layer on the surface layer, and forming a bending reducing layer on the dielectric constant-increasing layer; removing the mold pattern and at least a portion of the surface layer such that a portion of the dielectric constant-increasing layer is exposed after the mold pattern is removed; forming a dielectric layer on the lower electrode and the support pattern; and forming an upper electrode on the dielectric layer, wherein the lower electrode has a pillar-like shape extending in a vertical direction, after the mold pattern is removed and before the dielectric layer is formed, the surface layer comprises a first side portion in direct contact with the support pattern and a second side portion exposed by the removal of the mold pattern, and a thickness of the second side portion of the surface layer in a horizontal direction perpendicular to the vertical direction is less than a thickness of the first side portion of the surface layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Below, some example embodiments of the present disclosure will be described in detail and clearly to such an extent that an ordinary one in the art easily implements the present disclosure. In the description and in the accompanying drawings, like numerals refer to like elements throughout. Therefore, the repeated descriptions of like element may be omitted. Below, the term "and/or" is interpreted as including any one of items listed with regard to the term, or a combination of some of the listed items.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

Figure 1:
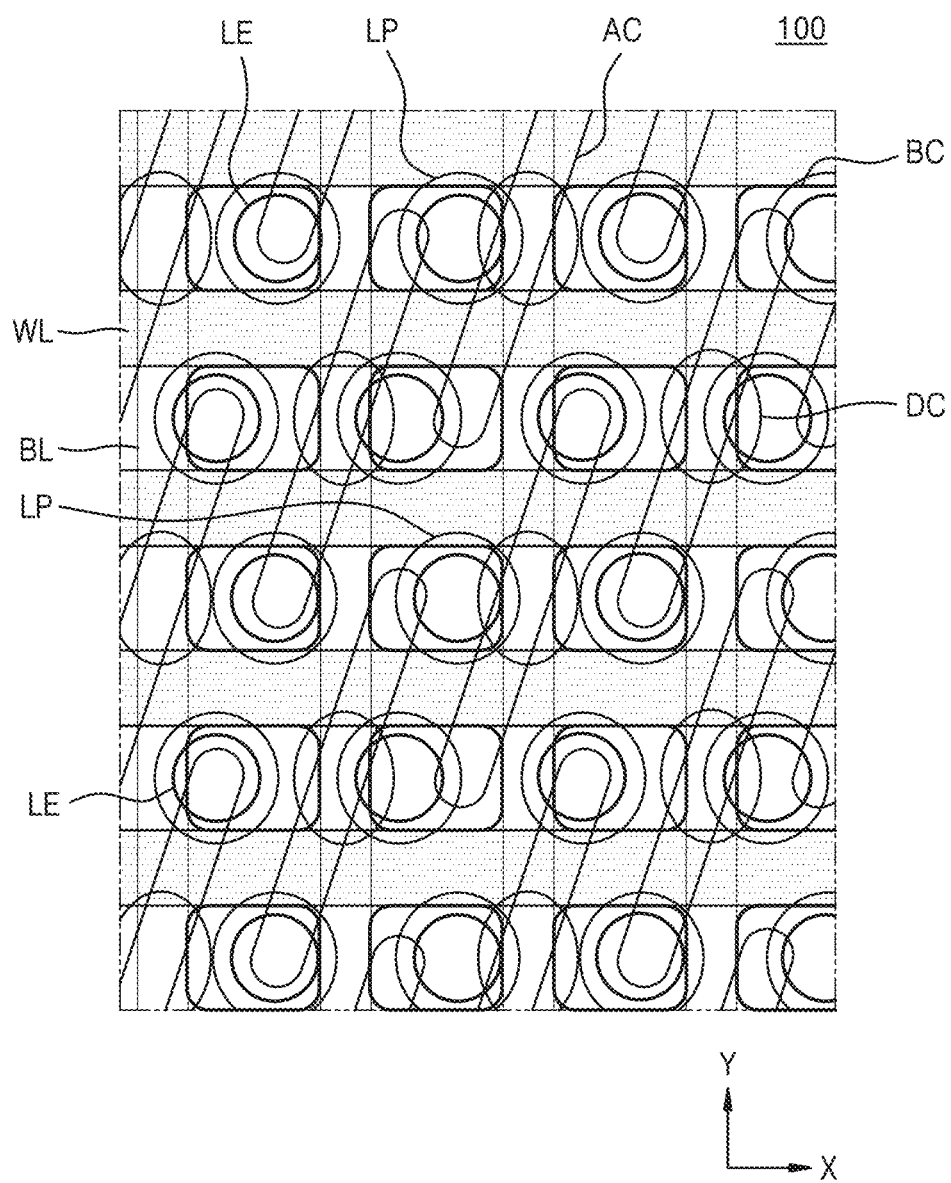
FIG. 1 is a plan view of a semiconductor device according to some example embodiments of the inventive concepts.

FIG. 1 is a plan view of a semiconductor device 100 according to some example embodiments of the inventive concepts.

Referring to FIG. 1, the semiconductor device 100 may include a plurality of active regions AC. The active regions AC may be elongated in a direction diagonal to a first horizontal direction (e.g., a X direction) and a second horizontal direction (e.g., a Y direction). A plurality of word lines WL may extend in parallel to one another in the first horizontal direction (X direction) across the active regions AC. A plurality of bit lines BL may extend in parallel to one another in the second horizontal direction (Y direction) over the word lines WL. The bit lines BL may be connected to the active regions AC via a plurality of direct contacts DC, respectively.

A plurality of buried contacts BC may be arranged between two bit lines BL adjacent to each other from among the bit lines BL. A plurality of landing pads LP may be respectively arranged on the plurality of buried contacts BC. The landing pads LP may be arranged to overlap the buried contacts BC at least partially, respectively. A plurality of lower electrodes LE may be arranged on the landing pads LP, respectively. The lower electrodes LE may be connected to the active regions AC through the buried contacts BC and the landing pads LP, respectively.

Figure 2A:
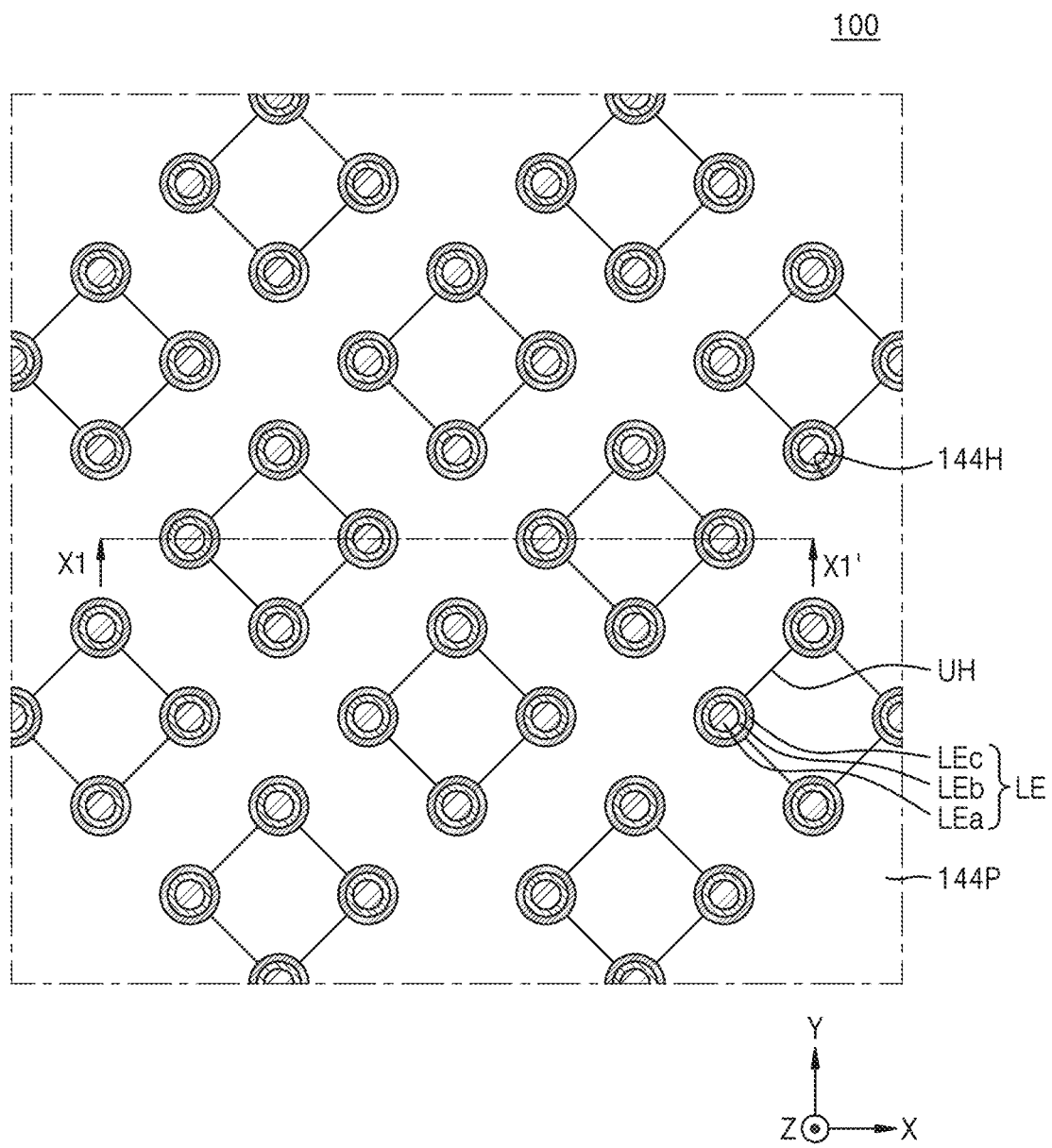
FIG. 2A is a plan view of the semiconductor device according to some example embodiments of the inventive concepts.
Figure 2B:
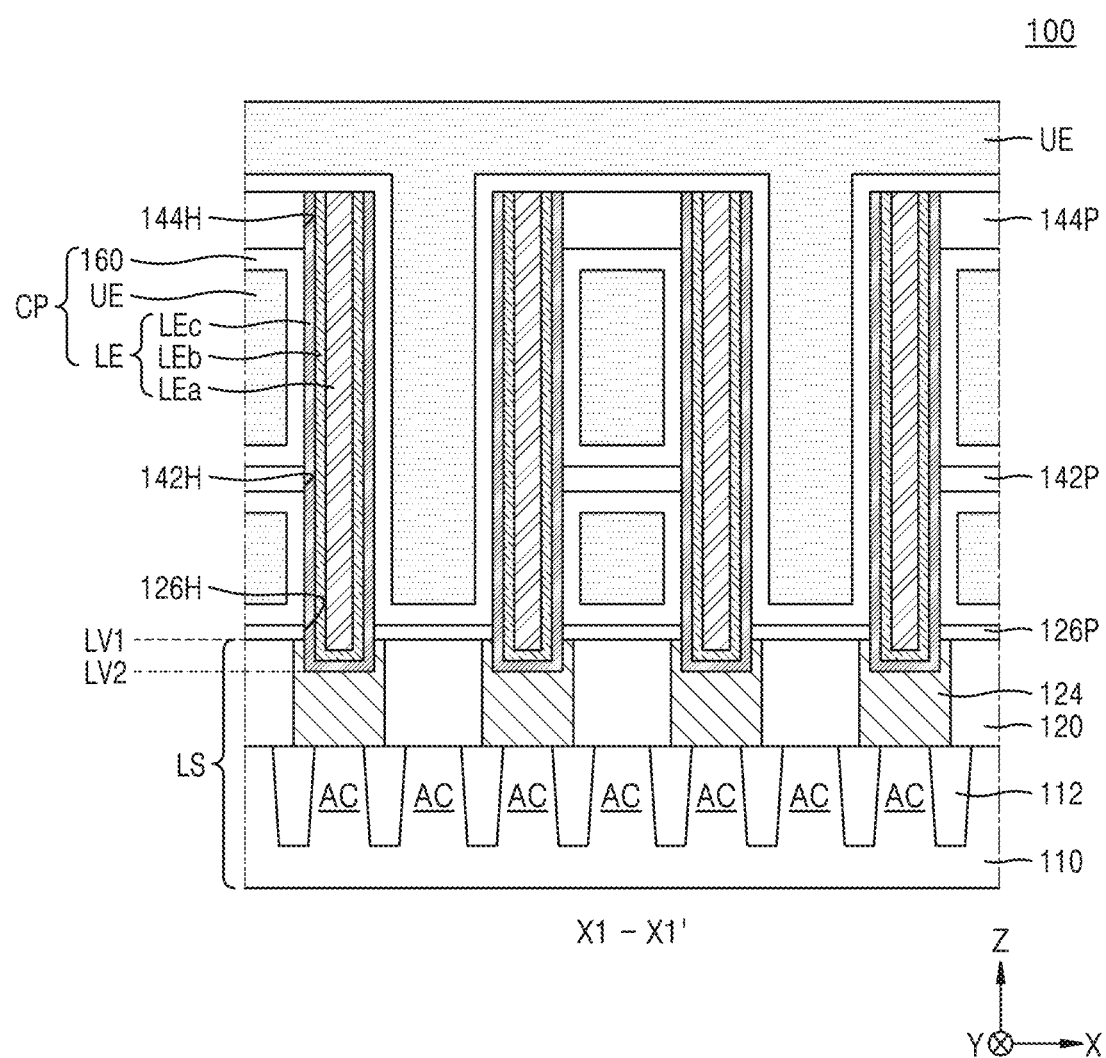
FIG. 2B is a cross-sectional view of the semiconductor device according to some example embodiments of the inventive concepts, taken along a line X1-X1' of FIG. 2A.

FIG. 2A is a plan view of the semiconductor device 100 according to some example embodiments of the inventive concepts. FIG. 2B is a cross-sectional view of the semiconductor device 100 according to some example embodiments of the inventive concepts, taken along a line X1-X1' of FIG. 2A.

Referring to FIGS. 2A and 2B, the semiconductor device 100 may include a lower structure LS and a plurality of capacitors CP on the lower structure LS.

The lower structure LS may include a substrate 110 including the active regions AC, a device isolation layer 112, a conductor 124, and an insulator 120. In some embodiments, the lower structure LS may further include the bit lines BL, the word lines WL, and the direct contacts DC described with reference to FIG. 1. For example, the substrate 110 may include a semiconductor element, such as Si and/or Ge, and/or a compound semiconductor, such as SiC, GaAs, InAs, and/or InP. The device isolation layer 112 may define the active regions AC in the substrate 110. For example, the device isolation layer 112 may include an insulating material such as oxide, a nitride, a combination thereof, and/or the like.

The insulator 120 may be disposed on the substrate 110. The insulator 120 may fill spaces between the conductors 124. The insulator 120 may include an insulating material including, for example, silicon oxide, silicon nitride, a combination thereof, and/or the like. The conductors 124 may include a conductive material including, for example, polysilicon, a metal, a conductive metal nitride, a metal silicide, a combination thereof, and/or the like. The conductors 124 may include (and or be) the buried contacts BC and the landing pads LP described above with reference to FIG. 1.

The capacitors CP may include the lower electrodes LE, a dielectric layer 160, and an upper electrode UE. For example, at least two neighboring capacitors CP may share with each other the dielectric layer 160 and the upper electrode UE. The lower electrodes LE may be positioned on the conductors 124, respectively. A lower electrode LE may have a pillar-like shape extending from a conductor 124 in a vertical direction (e.g., a Z direction). In some embodiments, as shown in FIG. 2B, a level LV2 in the vertical direction (Z direction) of the bottom surface of the lower electrode LE in the vertical direction (Z direction) may be lower than a level LV1 of the top surface of the conductor 124 in the vertical direction (Z direction). In other words, the top surface of the conductor 124 may be partially recessed. In another embodiment, unlike as shown in FIG. 2B, the bottom surface of the lower electrode LE may be at the same level as the top surface of the conductor 124 in the vertical direction (Z direction). In other words, the top surface of the conductor 124 may not be recessed.

The lower electrode LE may include a bending reducing layer LEa and a dielectric constant-increasing layer LEb between the bending reducing layer LEa and the dielectric layer 160. In some embodiments, the lower electrode LE may further include a surface layer LEc on the dielectric constant-increasing layer LEb (e.g., between the dielectric constant-increasing layer LEb and the dielectric layer 160). The bending reducing layer LEa may have a pillar-like shape extending in the vertical direction (Z direction). The dielectric constant-increasing layer LEb may extend on side surfaces and the bottom surface of the bending reducing layer LEa. The dielectric constant-increasing layer LEb may have a closed-bottomed cylinder-like shape. The surface layer LEc may extend on the side surfaces and the bottom surface of the dielectric constant-increasing layer LEb. The surface layer LEc may have a closed-bottomed cylinder-like shape. The surface layer LEc may be between the dielectric constant-increasing layer LEb and the dielectric layer 160. For example, in some embodiments, the surface layer LEc may be disposed on the conductor 124; the dielectric constant-increasing layer LEb may be disposed on the surface layer LEc; and/or the bending reducing layer LEa may be disposed on the dielectric constant-increasing layer LEb.

The bending reducing layer LEa may reduce the degree of bending of the lower electrode LE due to a high aspect ratio of the lower electrode LE. To this end, the bending reducing layer LEa may include a material having an elastic modulus greater than those of the dielectric constant-increasing layer LEb and/or the surface layer LEc. For example, the bending reducing layer LEa may include Ti, N, and X1, where X1 may be at least one element other than Ti and N. For example, X1 may include Si, W, C, Al, and/or a combination thereof. For example, in some embodiments, when the surface layer LEc includes TiN and the dielectric constant-increasing layer LEb includes NbN, the bending reducing layer LEa may include TiSiN. Chemical formulas used herein, e.g., "TiN", "NbN", "TiSiN", and the like, list elements included in each material and do not represent a stoichiometric relationship. Although the dielectric constant-increasing layer LEb has a relatively low elastic modulus and thus is vulnerable to bending, the bending reducing layer LEa having a relatively high elastic modulus may reduce bending of the lower electrode LE.

The dielectric constant-increasing layer LEb may affect the crystallinity of the dielectric layer 160 formed on the dielectric constant-increasing layer LEb, and thus, the dielectric layer 160 having an increased dielectric constant may be formed. For example, in some embodiments, the composition of the dielectric constant-increasing layer LEb, and/or the dielectric layer 160 may be selected such that the dielectric constant-increasing layer LEb may cause (or induce) a higher ratio of crystalline phases having a higher dielectric constant to be formed in the dielectric layer 160. Therefore, the dielectric constant-increasing layer LEb may increase the capacitance of a capacitor CP. For example, the dielectric constant-increasing layer LEb may include X2 and X3, wherein X2 may include Mo, Ta, Ru, Nb, and/or a combination thereof, and X3 may include N, O, and/or a combination thereof. For example, when the dielectric layer 160 includes $HfO_2$ and/or $ZrO_2$, the dielectric constant-increasing layer LEb including NbN may affect the crystallinity of the dielectric layer 160, and thus, the dielectric layer 160 with an increased dielectric constant may be formed.

Figure 7A:
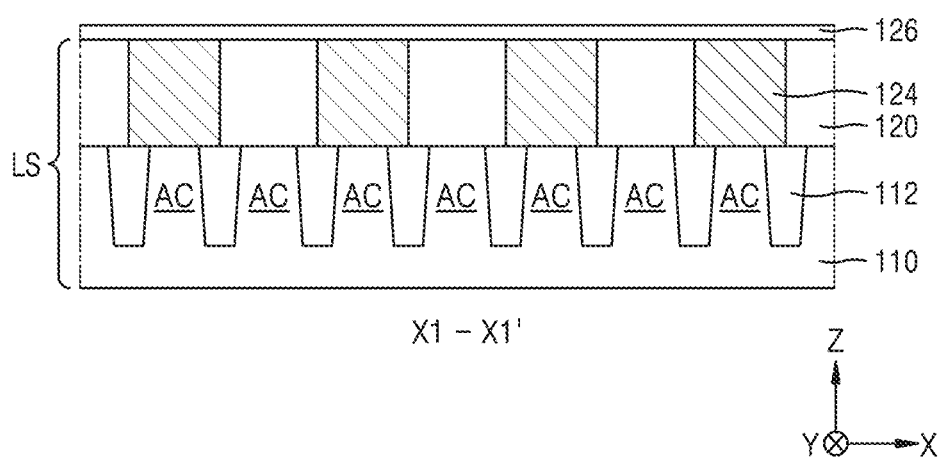
FIGS. 7A to 7E are cross-sectional diagrams showing a method of manufacturing a semiconductor device, according to some example embodiments of the inventive concepts.
Figure 7B:
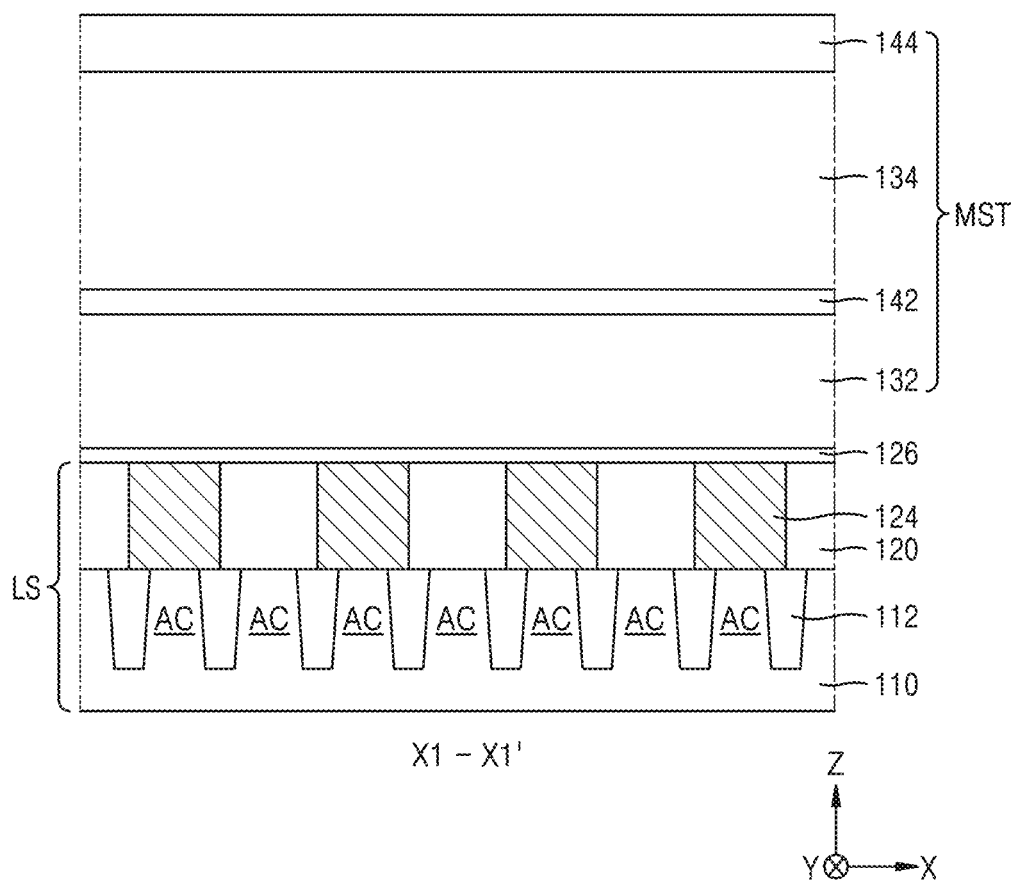
Figure 7C:
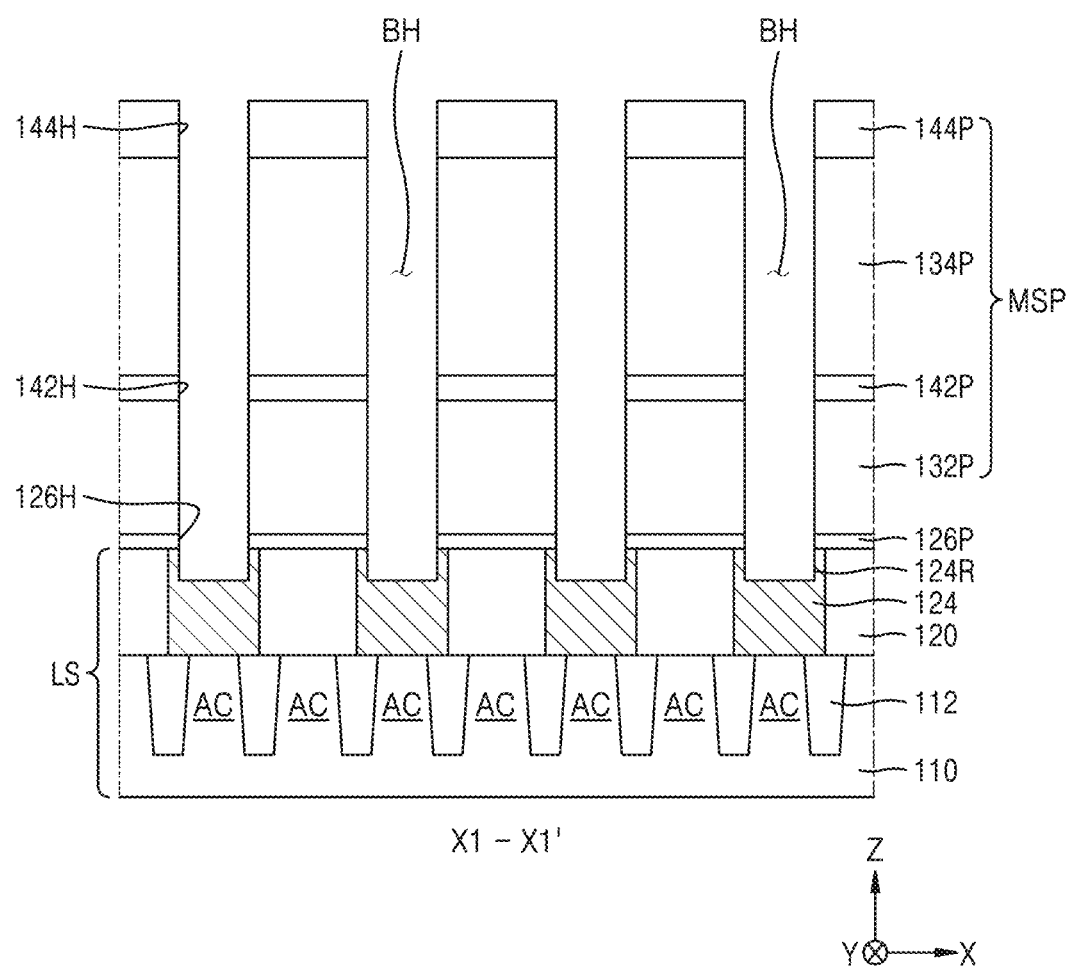
Figure 7D:
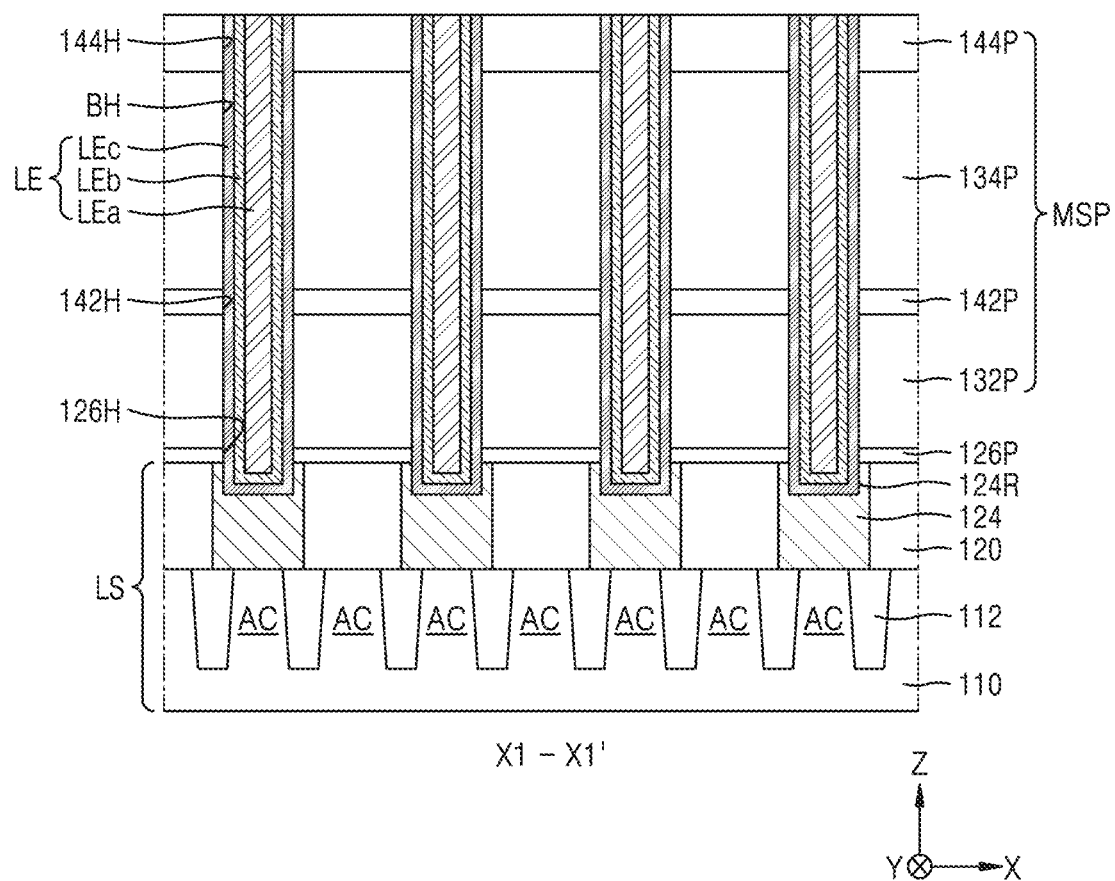

The surface layer LEc may facilitate formation of the dielectric constant-increasing layer LEb in a mold structure pattern MSP (refer to FIG. 7D). Also, the surface layer LEc may protect the dielectric constant-increasing layer LEb from an etchant while removing a first mold pattern 132P (refer to FIG. 7d) and a second mold pattern 134P (refer to FIG. 7d) of the mold structure pattern MSP, refer to FIG. 7d). The surface layer LEc may include, for example, TiN. In some example embodiments, a material of the surface layer LEc may be selected to include a similar crystal structure and/or lattice constant to the dielectric constant-increasing layer LEb and/or to include an intermediary crystal structure and/or lattice constant between the dielectric constant-increasing layer LEb and the dielectric layer 160.

The dielectric layer 160 may be between the lower electrodes LE and the upper electrodes UE. The dielectric layer 160 may include a high-k material. A high-k material refers to a dielectric material having a higher dielectric constant than silicon oxide. The dielectric layer 160 may include, for example, at least one of $HfO_2$, $ZrO_2$, $Al_2O_3$, $La_2O_3$, $Ta_2O_3$, $Nb_2O_5$, $CeO_2$, $TiO_2$, $GeO_2$, combinations thereof, and/or the like. For example, the dielectric layer 160 may include at least one of $HfO_2$ and/or $ZrO_2$.

The upper electrode UE may be positioned on the dielectric layer 160 and/or may encircle the lower electrode LE. The upper electrode UE may include a conductive material such as a metal, a conductive metal oxide, a conductive metal nitride, a conductive metal oxynitride, a combination thereof, and/or the like. The upper electrode UE may include, for example, Nb, NbO, NbN, NbON, Ti, TiO, TiN, TiON, Co, CoO, CoN, CoON, Sn, SnO, SnN, SnON, a combination thereof, and/or the like. For example, the upper electrode UE may include TiN. According to another embodiment, the upper electrode UE may include TaN, TiAlN, TaAlN, V, VN, Mo, MoN, W, WN, Ru, $RuO_2$, $SrRuO_3$, Ir, $IrO_2$, Pt, PtO, $SRO(SrRuO_3)$, $BSRO((Ba,Sr)RuO_3)$, $CRO(CaRuO_3)$, $LSCO((La,Sr)CoO_3)$, a combination thereof, and/or the like.

According to some embodiments, although not shown in FIG. 2B, the capacitor CP may further include a leakage current-reducing layer between the dielectric layer 160 and the upper electrode UE. The leakage current-reducing layer may reduce a leakage current between the upper electrode UE and the lower electrode LE. For example, the leakage current-reducing layer may include $TiO_2$.

The semiconductor device 100 may further include an etch stop pattern 126P on the lower structure LS. The etch stop pattern 126P may have a plurality of holes 126H, and the lower electrodes LE may pass through the holes 126H of the etch stop pattern 126P, respectively. The etch stop pattern 126P may contact the surface layer LEc of the lower electrode LE. The etch stop pattern 126P may include, for example, SiN, SiCN, SiBN, a combination thereof, and/or the like. The dielectric layer 160 may further extend onto the etch stop pattern 126P.

The semiconductor device 100 may further include a first support pattern 142P and a second support pattern 144P supporting the lower electrode LE. The second support pattern 144P may be apart from the etch stop pattern 126P in the vertical direction (Z direction) and may extend on a plane perpendicular to the vertical direction (Z direction). The second support pattern 144P may include a plurality of holes 144H, and the lower electrodes LE may pass through the holes 144H of the second support pattern 144P, respectively. The second support pattern 144P may contact side surfaces of the upper portion of the lower electrode LE. According to some embodiments, the top surface of each of the lower electrodes LE and the top surface of the second support pattern 144P may be on the same plane. The dielectric layer 160 may further extend onto the second support pattern 144P.

The first support pattern 142P may extend between the etch stop pattern 126P and the second support pattern 144P on a plane perpendicular to the vertical direction (Z direction). The first support pattern 142P may be spaced apart from the etch stop pattern 126P in the vertical direction (Z direction), and the second support pattern 144P may be vertically apart from the first support pattern 142P in the vertical direction (Z direction). The first support pattern 142P may have a plurality of holes 142H, and the lower electrodes LE may pass through the holes 142H of the first support pattern 142P, respectively. The first support pattern 142P may contact side surfaces of the middle portion of the lower electrode LE. The dielectric layer 160 may further extend onto the first support pattern 142P.

As shown in FIG. 2A, the second support pattern 144P may include a plurality of upper holes UH. As shown in FIG. 2A, a planar shape of each of the upper holes UH may be a rhombus-like shape, and four lower electrodes LE may be positioned at vertices of the rhombus, respectively. However, the planar shape of each of the upper holes UH is not limited to the shape shown in FIG. 2A. The first support pattern 142P may include a plurality of lower holes LH (refer to FIG. 7E) having a planar shape corresponding to the planar shape of the upper holes UH.

In some example embodiments, the first support pattern 142P and the second support pattern 144P may each include an insulating material such as SiN, SiCN, SiBN, a combination thereof, and/or the like. According to some embodiments, the first support pattern 142P and the second support pattern 144P may include the same material as each other. For example, the first support pattern 142P and the second support pattern 144P may each include SiCN. According to another embodiment, the first support pattern 142P and the second support pattern 144P may include different materials from one another. For example, the first support pattern 142P may include SiCN, and the second support pattern 144P may include SiBN.

Figure 3:
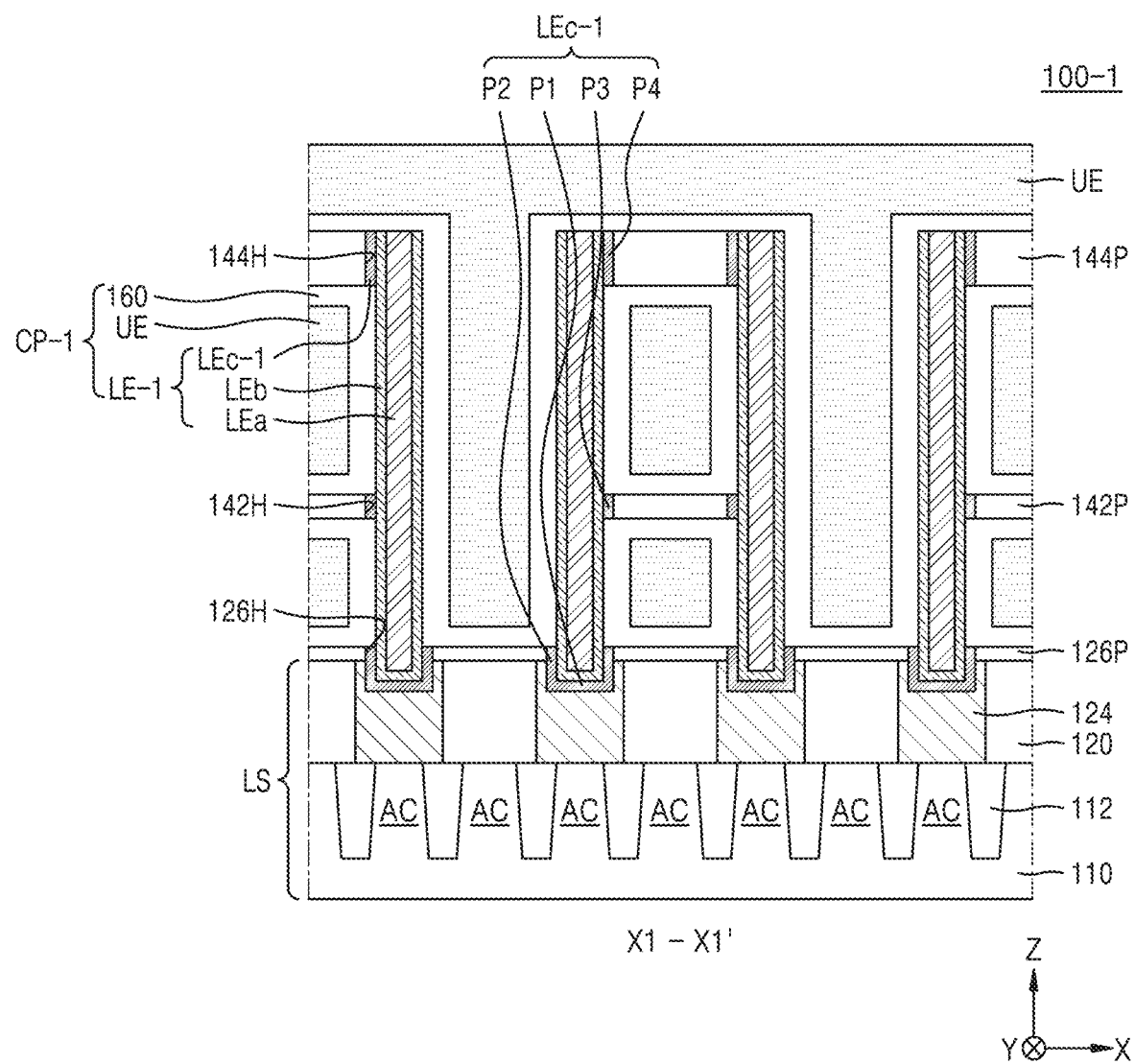
FIG. 3 is a cross-sectional view of a semiconductor device according to some example embodiments of the inventive concepts.

FIG. 3 is a plan view of a semiconductor device 100-1 according to some example embodiments of the inventive concepts. Hereinafter, differences between the semiconductor device 100 shown in FIGS. 1, 2A, and 2B and the semiconductor device 100-1 shown in FIG. 3 will be described.

Referring to FIG. 3, the semiconductor device 100-1 may include the lower structure LS and a plurality of capacitors CP-1 on the lower structure LS. The capacitors CP-1 may include a plurality of lower electrodes LE-1 on the lower structure LS, the dielectric layer 160 on the lower electrodes LE-1, and the upper electrode UE on the dielectric layer 160. A lower electrode LE-1 may include a surface layer LEc-1 on the lower structure LS, the dielectric constant-increasing layer LEb on the surface layer LEc-1, and the bending reducing layer LEa on the dielectric constant-increasing layer LEb. A portion of the dielectric constant-increasing layer LEb may be in direct contact with the dielectric layer 160. The reason therefor is that, during removal of the first mold pattern 132P (refer to FIG. 7D) and the second mold pattern 134P (refer to FIG. 7D), a portion of the surface layer LEc-1 may be removed together therewith, and thus, the dielectric constant-increasing layer LEb may be exposed.

The surface layer LEc-1 may include a first side portion P3 between the first support pattern 142P and the dielectric constant-increasing layer LEb. The surface layer LEc-1 may further include a second side portion P4 between the second support pattern 144P and the dielectric constant-increasing layer LEb. The second side portion P4 of the surface layer LEc-1 may be spaced apart from the first side portion P3 of the surface layer LEc-1 in the vertical direction (Z direction). The surface layer LEc-1 may further include a bottom portion P1 between the lower structure LS and the bottom of the dielectric constant-increasing layer LEb. The first side portion P3 of the surface layer LEc-1 may be spaced apart from the bottom portion P1 of the surface layer LEc-1 in the vertical direction (Z direction). According to some embodiments, the surface layer LEc-1 may further include a third side portion P2 between the lower structure LS and side surfaces of the dielectric constant-increasing layer LEb. The third side portion P2 of the surface layer LEc-1 may extend along side surfaces of the dielectric constant-increasing layer LEb in the vertical direction (Z direction) from the bottom portion P1 of the surface layer LEc-1.

Figure 4:
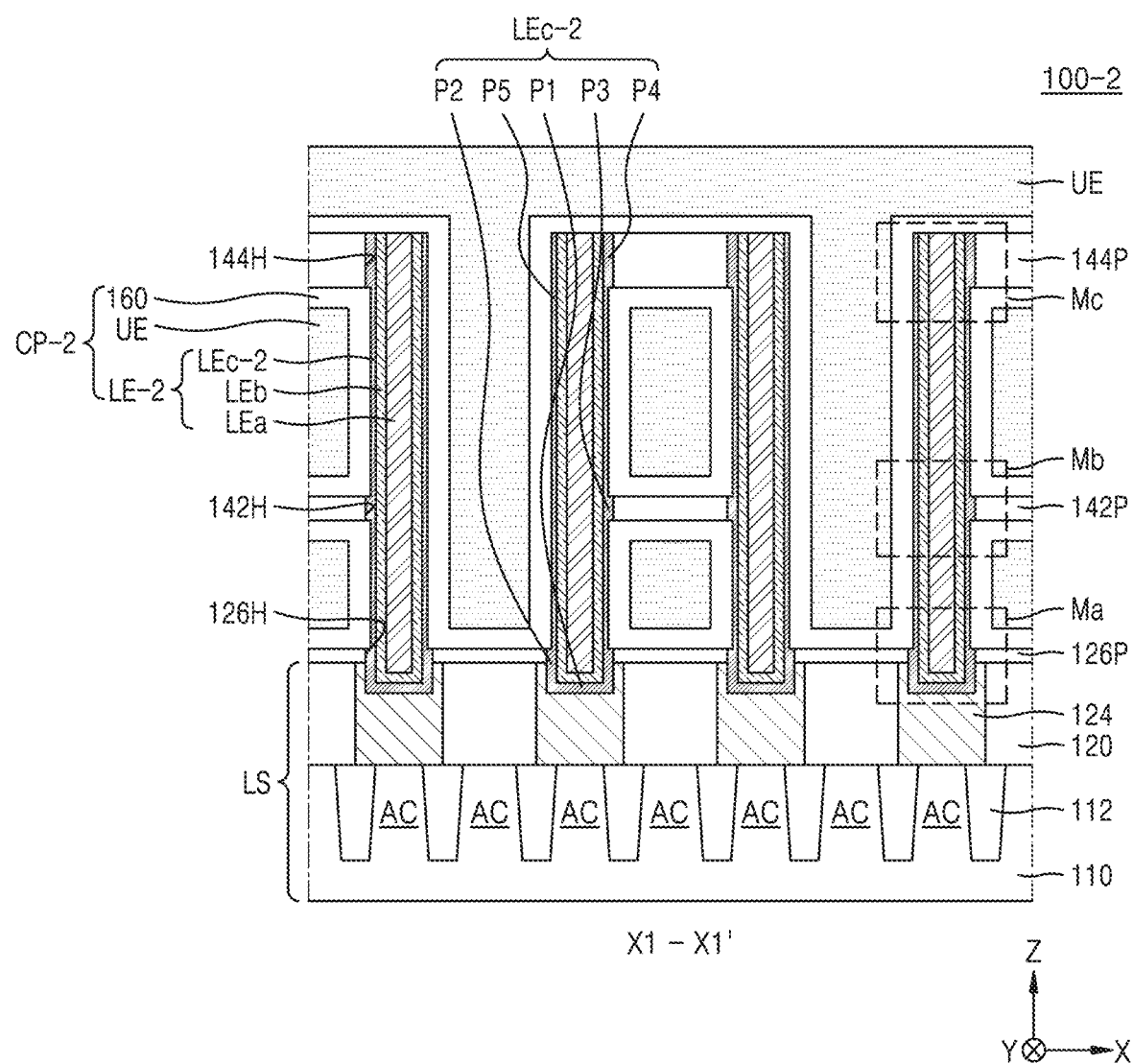
FIG. 4 is a cross-sectional view of a semiconductor device according to some example embodiments of the inventive concepts.
Figure 5A:
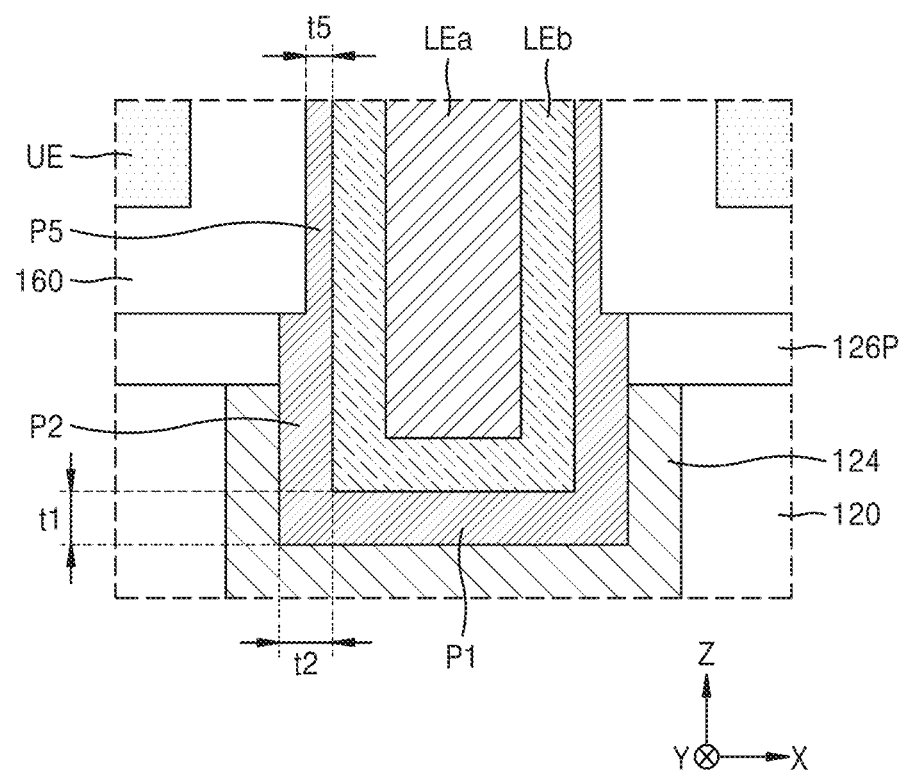
FIG. 5A is an enlarged view of a region Ma of FIG. 4.
Figure 5B:
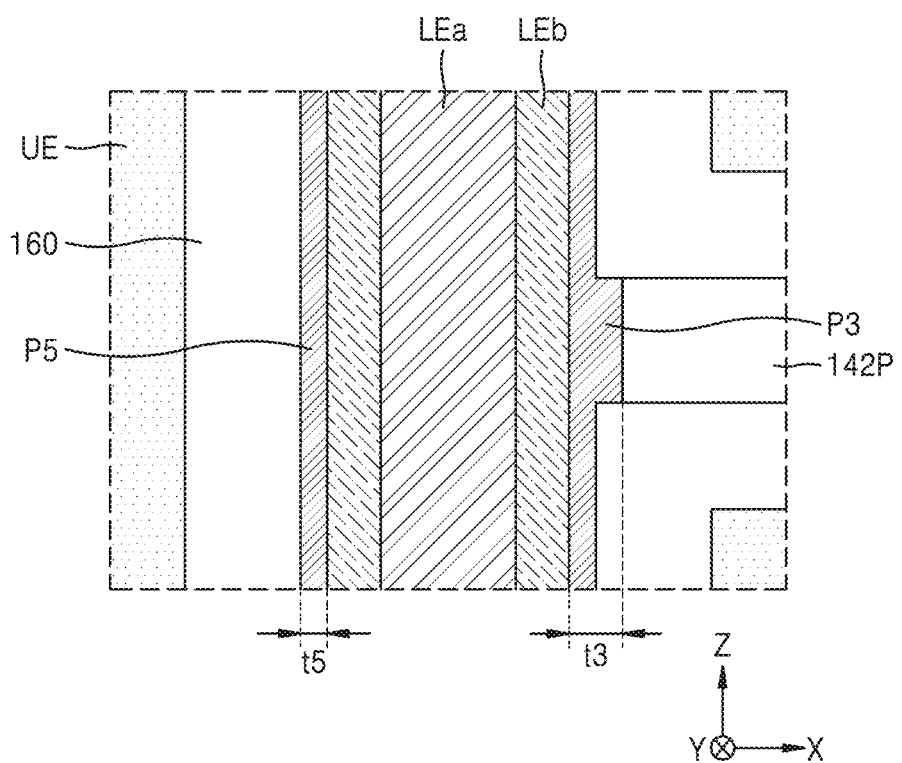
FIG. 5B is an enlarged view of a region Mb of FIG. 4.
Figure 5C:
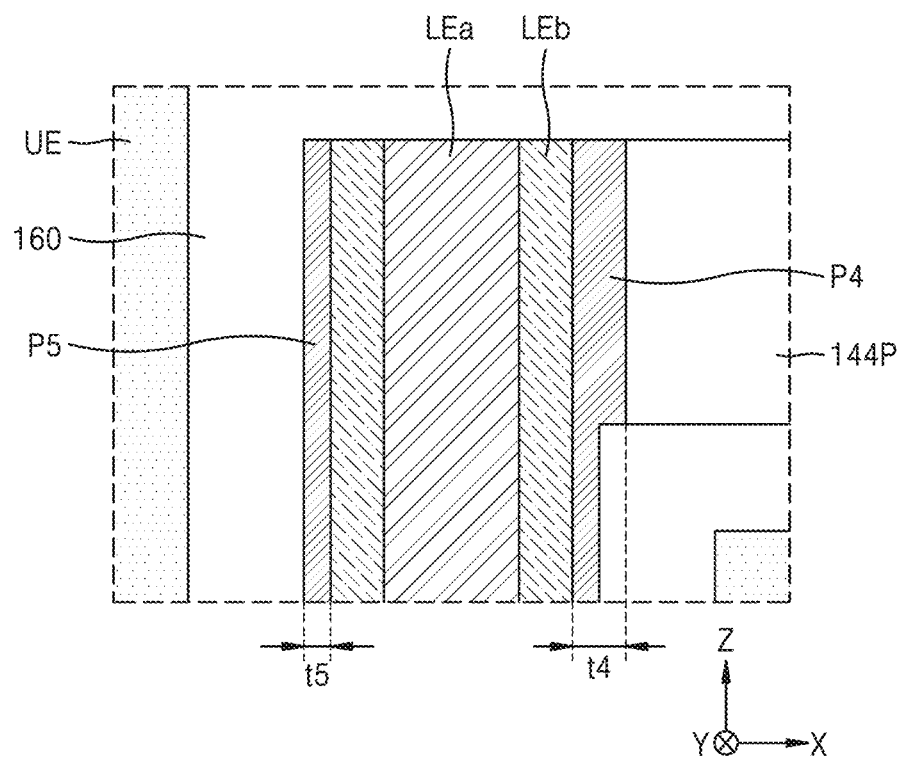
FIG. 5C is an enlarged view of a region Mc of FIG. 4.

FIG. 4 is a plan view of a semiconductor device 100-2 according to example embodiments of the inventive concepts. FIG. 5A is an enlarged view of a region Ma of FIG. 4. FIG. 5B is an enlarged view of a region Mb of FIG. 4. FIG. 5C is an enlarged view of a region Mc of FIG. 4.

Hereinafter, differences between the semiconductor device 100-2 shown in FIGS. 4 and 5A to 5C and the semiconductor device 100-1 shown in FIG. 3 will be described.

Referring to FIGS. 4 and 5A to 5C, the semiconductor device 100-2 may include the lower structure LS and a plurality of capacitors CP-2 on the lower structure LS. The capacitors CP-2 may include a plurality of lower electrodes LE-2 on the lower structure LS, the dielectric layer 160 on the lower electrodes LE-2, and the upper electrode UE on the dielectric layer 160. A lower electrode LE-2 may include a surface layer LEc-2 on the lower structure LS, the dielectric constant-increasing layer LEb on the surface layer LEc-2, and the bending reducing layer LEa on the dielectric constant-increasing layer LEb. The bending reducing layer LEa may have a pillar-like shape extending in the vertical direction (Z direction).

The surface layer LEc-2 may further include a fourth side portion P5 in direct contact with the dielectric layer 160. In some embodiments, the fourth side portion P5 of the surface layer LEc-2 may extend between the first side portion P3 and the second side portion P4 of the surface layer LEc-2 and the first side portion P3 and the third side portion P2 of the surface layer LEc-2.

As shown in FIG. 5B, a thickness t5 of the fourth side portion P5 of the surface layer LEc-2 in the first horizontal direction (X direction) may be less than a thickness t3 of the first side portion P3 of the surface layer LEc-2 in the first horizontal direction (X direction). As shown in FIG. 5C, the thickness t5 of the fourth side portion P5 of the surface layer LEc-2 in the first horizontal direction (X direction) may be less than a thickness t4 of the second side portion P4 of the surface layer LEc-2 in the first horizontal direction (X direction). As shown in FIG. 5A, the thickness t5 of the fourth side portion P5 of the surface layer LEc-2 in the first horizontal direction (X direction) may be less than a thickness t1 of the bottom portion P1 of the surface layer LEc-2 in the vertical direction (Z direction). As shown in FIG. 5A, the thickness t5 of the fourth side portion P5 of the surface layer LEc-2 in the first horizontal direction (X direction) may be less than a thickness t2 of the third side portion P2 of the surface layer LEc-2 in the first horizontal direction (X direction). Since the fourth side portion P5 of the surface layer LEc-2 may be partially etched during the removal of the first mold pattern 132P (refer to FIG. 7D) and the second mold pattern 134P (refer to FIG. 7D), the fourth side portion P5 of the surface layer LEc-2 may be relatively thin.

Figure 6A:
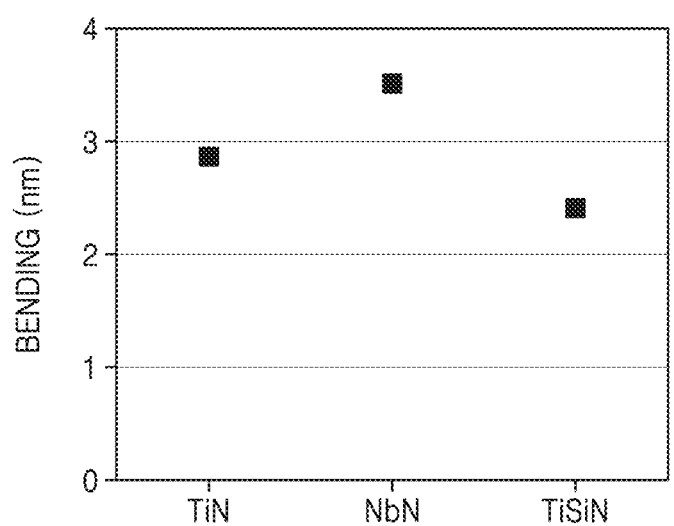
FIG. 6A is a graph showing the bending according to the material of a lower electrode.

FIG. 6A is a graph showing the bending according to the material of a lower electrode.

Referring to FIG. 6A, bending of the lower electrode 1) when the lower electrode includes TiN, 2) when the lower electrode includes NbN, and 3) when the lower electrode includes TiSiN are shown. NbN, which has the lowest elastic modulus from among the three materials, exhibited the greatest bending. TiSiN, which has the highest elastic modulus from among the three materials, exhibited the smallest bending. When NbN having a relatively low elastic modulus is used as a material constituting the lower electrode to increase the dielectric constant, it may be predicted that the bending of the lower electrode may increase. To prevent the bending of the lower electrode from increasing, TiSiN having a relatively high elastic modulus may be used together with NbN as materials constituting the lower electrode.

Figure 6B:
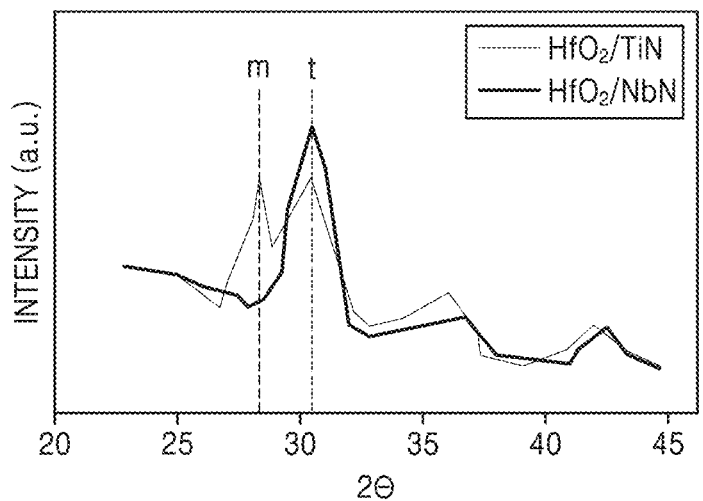
FIG. 6B is a diagram showing X-ray diffraction data of a dielectric layer formed on a lower electrode according to the material constituting the lower electrode.

FIG. 6B is a diagram showing X-ray diffraction data of a dielectric layer formed on a lower electrode according to the material constituting the lower electrode.

Referring to FIG. 6B, when a dielectric layer including $HfO_2$ is formed on a lower electrode including TiN, the intensity of a peak m of a monoclinic phase is similar to that of a peak t of a tetragonal phase. On the other hand, when a dielectric layer including $HfO_2$ is formed on a lower electrode including NbN, the intensity of the peak m of the monoclinic phase is significantly greater than that of the peak t of the tetragonal phase. In other words, by using a lower electrode including NbN, $HfO_2$ having an increased ratio of the tetragonal phase may be formed. Since $HfO_2$ of the tetragonal phase has a higher permittivity than $HfO_2$ of the monoclinic phase, a dielectric layer with increased permittivity may be formed by using a lower electrode including NbN. Therefore, a semiconductor device including a capacitor having an increased capacitance may be manufactured by using a lower electrode including NbN.

FIGS. 7A to 7E are cross-sectional diagrams showing a method of manufacturing a semiconductor device, according to example embodiments of the inventive concepts.

Referring to FIG. 7A, the lower structure LS may be manufactured. For example, a device isolation layer 112 defining the active regions AC may be formed in the substrate 110. Insulators 120 and conductors 124 may be formed on the substrate 110. Although FIG. 7A shows the insulators 120 and the conductors 124 only, the word lines WL (refer to FIG. 1), the bit lines BL (refer to FIG. 1), and the direct contacts DC (refer to FIG. 1) may be further formed. Next, an etch stop layer 126 may be formed on the lower structure LS. The etch stop layer 126 may include an insulating material having an etch selectivity with respect to the insulators 120. For example, in at least one example embodiment, wherein the insulators 120 include silicon oxide, the etch stop layer 126 may include SiN, SiCN, SiBN, a combination thereof, and/or the like.

Referring to FIG. 7B, a mold structure MST may be formed on the etch stop layer 126. The mold structure MST may include a plurality of mold layers and a plurality of support layers. For example, the mold structure MST may include a first mold layer 132, a first support layer 142, a second mold layer 134, and a second support layer 144 sequentially stacked on the etch stop layer 126.

The first mold layer 132 and the second mold layer 134 may each include a material that may be removed through a lift-off process using an etchant containing, for example, ammonium fluoride ($NH_4F$), hydrofluoric acid (HF), and water due to a relatively high etching rate with respect to the etchant. According to some embodiments, the first mold layer 132 and the second mold layer 134 may each include an oxide, a nitride, or a combination thereof. For example, the first mold layer 132 may include a borophosphosilicate glass (BPSG) layer. The BPSG layer may include at least one of a first portion in which a concentration of boron (B), which is a dopant, varies in the thickness-wise direction of the BPSG layer and a second portion in which a concentration of phosphorus (P) (phosphorus), which is a dopant, varies in the thickness direction of the BPSG layer. The second mold layer 134 may include a multiple insulating film in which relatively thin silicon oxide films and relatively thin silicon nitride films are alternately stacked a plurality of number of times or a silicon nitride film.

The first support layer 142 and the second support layer 144 may each include SiN, SiCN, SiBN, or a combination thereof. According to example embodiments, the first support layer 142 and the second support layer 144 may include the same material as each other. For example, the first support layer 142 and the second support layer 144 may each include SiCN. According to other example embodiments, the first support layer 142 and the second support layer 144 may include different materials from one another. For example, the first support layer 142 may include SiCN and the second support layer 144 may include SiBN.

Referring to FIGS. 7B and 7C, by forming a plurality of holes BH penetrating through the mold structure MST and the etch stop layer 126 and exposing the conductors 124, the mold structure pattern MSP and the etch stop pattern 126P may be formed. For example, a mask pattern may be formed on the mold structure MST, and the mold structure MST may be anisotropically etched by using the mask pattern as an etch mask. The mask pattern may include a nitride, an oxide, polysilicon, photoresist, a combination thereof, and/or the like.

The mold structure pattern MSP may include the first mold pattern 132P, the first support pattern 142P, the second mold pattern 134P, and the second support pattern 144P sequentially stacked on the etch stop layer 126. The holes 142H of the first support pattern 142P and the holes 144H of the second support pattern 144P may be formed by anisotropic etching. The holes 142H of the first support pattern 142P and the holes 144H of the second support pattern 144P may be parts of the holes BH of the mold structure pattern MSP.

A process of forming the holes BH may further include a process of wet-treating a resultant obtained by anisotropically etching the mold structure MST. The etch stop layer 126 may also be partially etched while performing a process of anisotropically etching the mold structure MST and wet-treating the resultant of the anisotropic etching. As a result, the etch stop pattern 126P including the holes 126H respectively exposing the conductors 124 may be obtained. Also, the top surfaces of the conductors 124 may be recessed. For the wet-treatment, for example, an etchant including a diluted sulfuric peroxide (DSP) solution may be used. According to another embodiment, the etch stop layer 126 may also be partially etched by anisotropic etching, and thus, the etch stop pattern 126P may be formed.

Referring to FIG. 7D, the lower electrodes LE may be formed in the holes BH of the mold structure pattern MSP, respectively. For example, the surface layer LEc may be formed on the top surface of the mold structure pattern MSP and sidewalls and bottoms of the holes BH. The dielectric constant-increasing layer LEb may be formed on the surface layer LEc. The bending reducing layer LEa may be formed on the dielectric constant-increasing layer LEb. The bending reducing layer LEa may be formed to have a pillar-like shape. The dielectric constant-increasing layer LEb may be disposed on side surfaces of the bending reducing layer LEa. The dielectric constant-increasing layer LEb may further extend between the bottom of the bending reducing layer LEa and the lower structure LS. The surface layer LEc may be located on side surfaces of the dielectric constant-increasing layer LEb. The surface layer LEc may further extend between the bottom of the dielectric constant-increasing layer LEb and the lower structure LS.

The surface layer LEc, the dielectric constant-increasing layer LEb, and the bending reducing layer LEa may be formed by atomic layer deposition (ALD). Since it may be difficult to form the dielectric constant-increasing layer LEb directly on the mold structure pattern MSP, the dielectric constant-increasing layer LEb may be formed over the mold structure pattern MSP by interposing the surface layer LEc between the mold structure pattern MSP and the dielectric constant-increasing layer LEb.

Next, portions of the surface layer LEc, the dielectric constant-increasing layer LEb, and the bending reducing layer LEa on the top surface of the mold structure pattern MSP may be removed, such that the top surface of the mold structure pattern MSP is exposed. The portions thereof may be removed, for example, by chemical-mechanical polishing (CMP) and/or an etch back. According to some embodiments, after the lower electrode LE is formed, the lower electrode LE may be annealed. According to another embodiment, a process of annealing the lower electrode LE may be omitted.

Figure 7E:
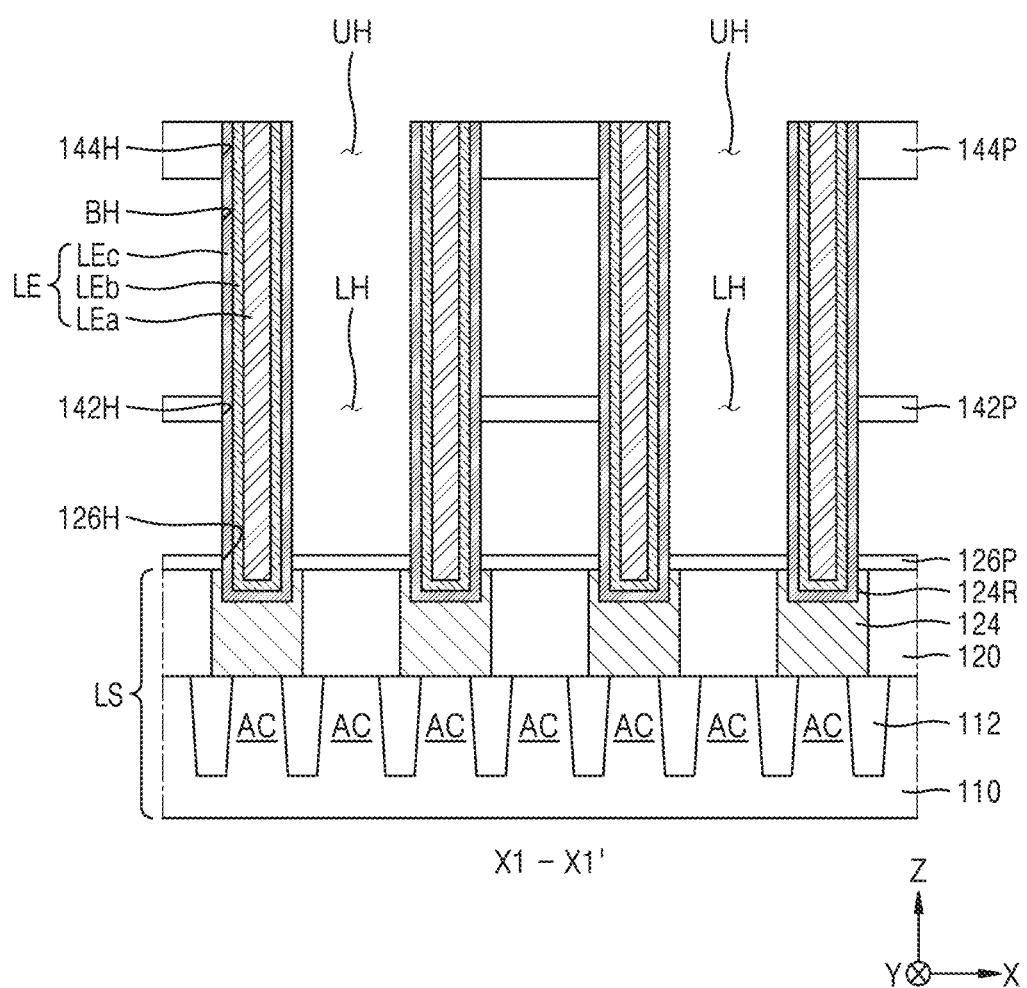

Referring to FIGS. 7D and 7E, the upper holes UH may be formed by removing a portion of the second support pattern 144P. Next, the second mold pattern 134P may be removed through the upper holes UH. For example, wet etching may be used to remove the second mold pattern 134P. Next, the lower holes LH may be formed by removing a portion of the first support pattern 142P. Next, the first mold pattern 132P may be removed through the lower holes LH. For example, wet etching may be used to remove the first mold pattern 132P. After the first mold pattern 132P and the second mold pattern 134P are removed, the surface layer LEc may be exposed. According to some embodiments, an etchant including, for example, ammonium fluoride ($NH_4F$), hydrofluoric acid (HF), and water may be used to remove the first mold pattern 132P and the second mold pattern 134P. While the first mold pattern 132P and the second mold pattern 134P are being removed, the surface layer LEc may protect the dielectric constant-increasing layer LEb. Also, the lower electrode LE may be supported by the first support pattern 142P and the second support pattern 144P, and the bending reducing layer LEa of the lower electrode LE may reduce the bending of the lower electrode LE.

The planar shape of each of the upper holes UH and the lower holes LH may be variously selected. For example, the planar shape of the upper holes UH may be as shown in FIG. 2A.

Referring to FIG. 2B, the dielectric layer 160 may be formed on the lower electrode LE, the first support pattern 142P, and the second support pattern 144P. The dielectric layer 160 may be formed by ALD. The dielectric constant-increasing layer LEb of the lower electrode LE may affect the crystallinity of the dielectric layer 160 formed on the lower electrode LE, thereby helping formation of the dielectric layer 160 having a higher permittivity.

Next, the upper electrode UE may be formed on the dielectric layer 160. To form the upper electrode UE, a chemical vapor deposition (CVD), metal organic CVD (MOCVD), physical vapor deposition (PVD), ALD process, and/or the like, may be used. The semiconductor device 100 shown in FIG. 2B may be manufactured according to the method described with reference to FIGS. 7A to 7E and 2B.

Figure 8:
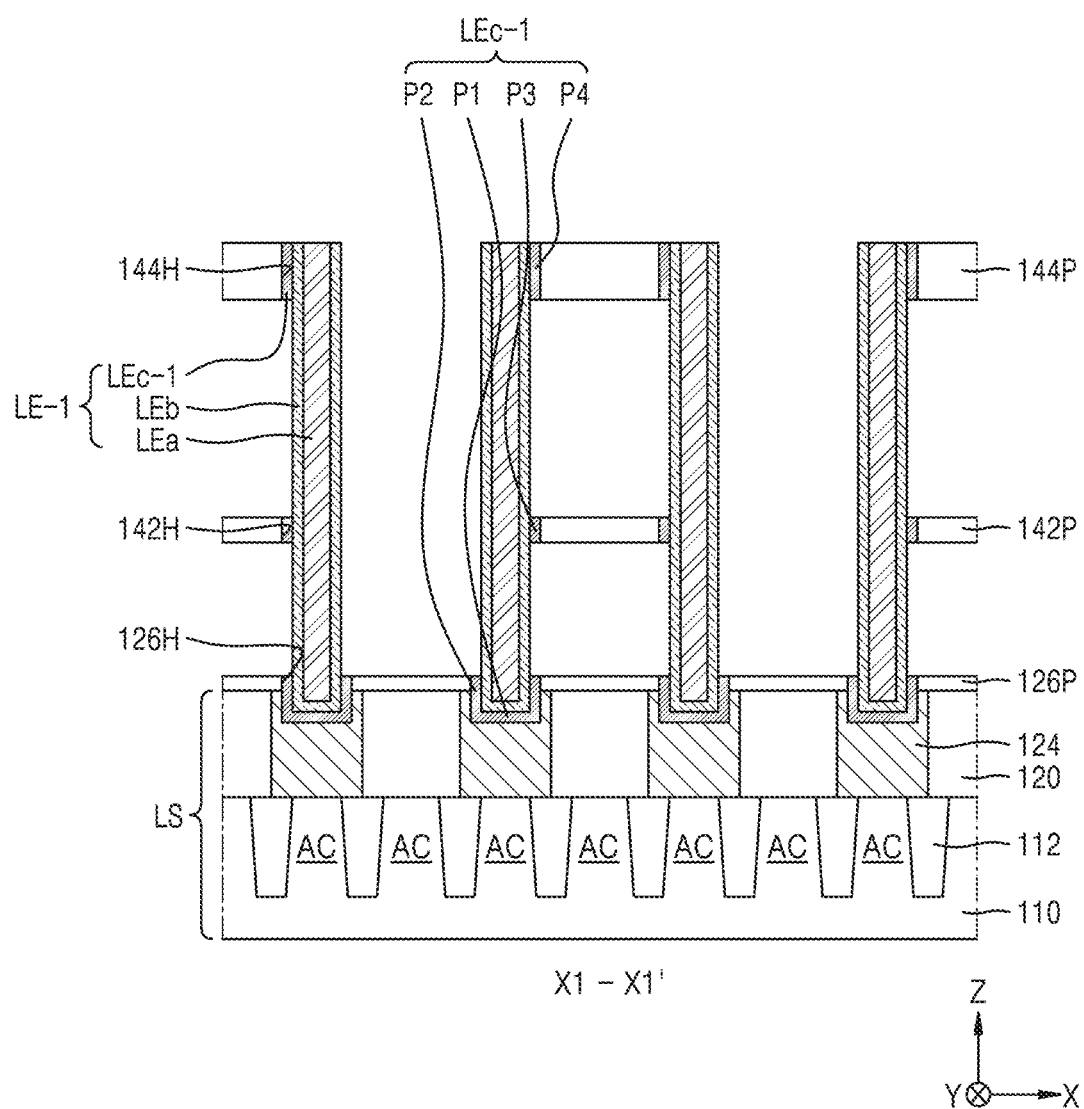
FIG. 8 is a cross-sectional view of a method of manufacturing a semiconductor device, according to some example embodiments of the inventive concepts.

FIG. 8 is a cross-sectional view of a method of manufacturing a semiconductor device, according to some example embodiments of the inventive concepts. Hereinafter, differences between the method of manufacturing a semiconductor device described above with reference to FIGS. 7A to 7E and 2B and the method of manufacturing a semiconductor device shown in FIG. 8 will be described.

Referring to FIGS. 7D and 8, the surface layer LEc-1 may be partially removed while the first mold pattern 132P and the second mold pattern 134P are being removed. As a result, after the first mold pattern 132P and the second mold pattern 134P are removed, a portion of the dielectric constant-increasing layer LEb may be exposed.

After the first mold pattern 132P and the second mold pattern 134P are removed, the surface layer LEc-1 may include the first side portion P3 between the first support pattern 142P and the dielectric constant-increasing layer LEb. After the first mold pattern 132P and the second mold pattern 134P are removed, the surface layer LEc-1 may further include the second side portion P4 between the second support pattern 144P and the dielectric constant-increasing layer LEb. The second side portion P4 of the surface layer LEc-1 may be spaced apart from the first side portion P3 of the surface layer LEc-1 in the vertical direction (Z direction).

After the first mold pattern 132P and the second mold pattern 134P are removed, the surface layer LEc-1 may further include the bottom portion P1 between the lower structure LS and the bottom of the dielectric constant-increasing layer LEb. The first side portion P3 of the surface layer LEc-1 may be spaced apart from the bottom portion P1 of the surface layer LEc-1 in the vertical direction (Z direction). According to some embodiments, after the first mold pattern 132P and the second mold pattern 134P are removed, the surface layer LEc-1 may further include the third side portion P2 between the lower structure LS and side surfaces of the dielectric constant-increasing layer LEb. The third side portion P2 of the surface layer LEc-1 may extend along side surfaces of the dielectric constant-increasing layer LEb in the vertical direction (Z direction) from the bottom portion P1 of the surface layer LEc-1.

Referring to FIG. 3, the dielectric layer 160 may be formed on the lower electrode LE-L the first support pattern 142P, and the second support pattern 144P. A portion of the dielectric constant-increasing layer LEb may be in direct contact with the dielectric layer 160. Next, the upper electrode UE may be formed on the dielectric layer 160. The semiconductor device 100-1 shown in FIG. 3 may be manufactured according to the method described with reference to FIGS. 7D, 8, and 3.

Figure 9:
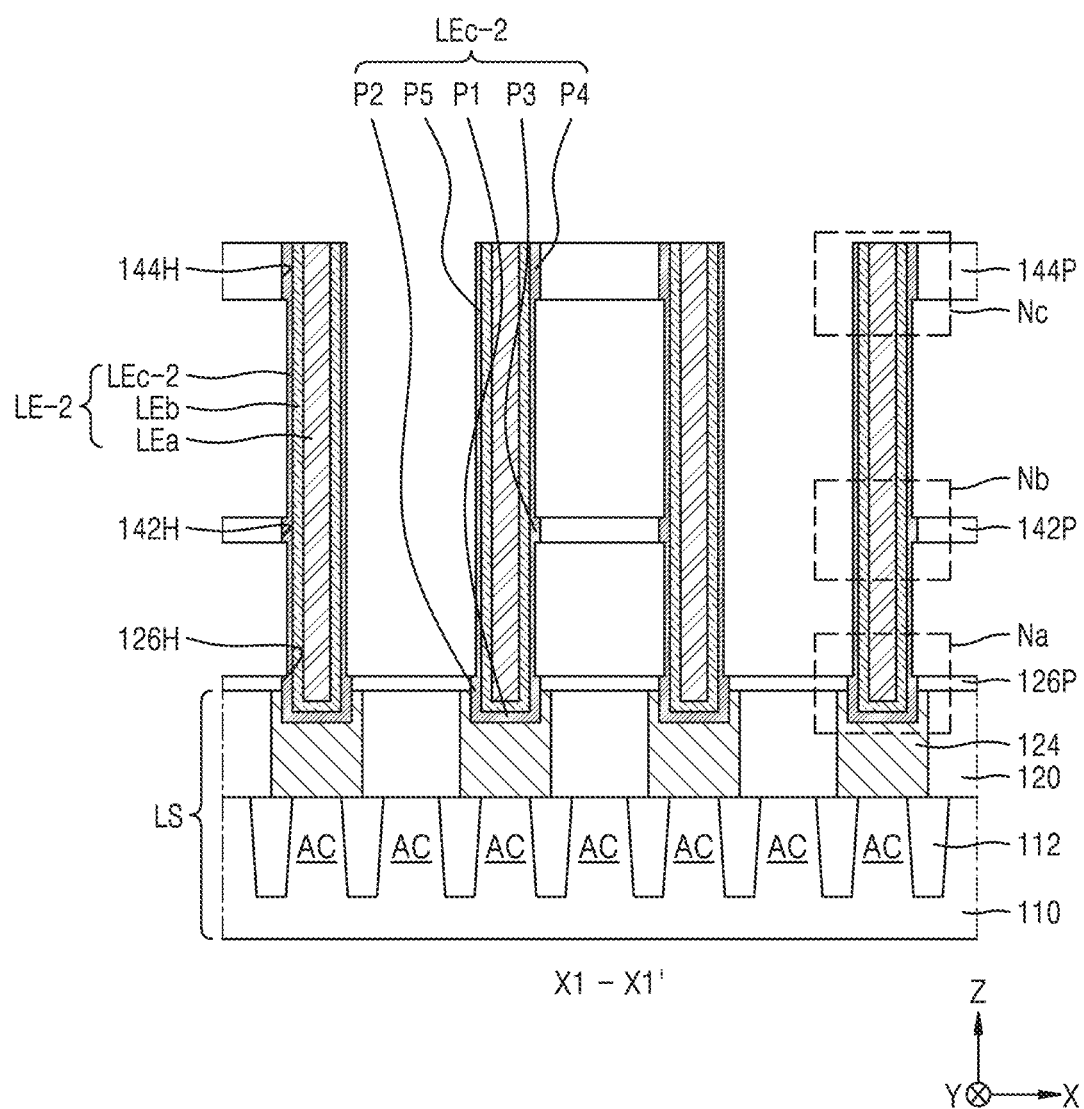
FIG. 9 is a cross-sectional view of a method of manufacturing a semiconductor device, according to some example embodiments of the inventive concepts.
Figure 10A:
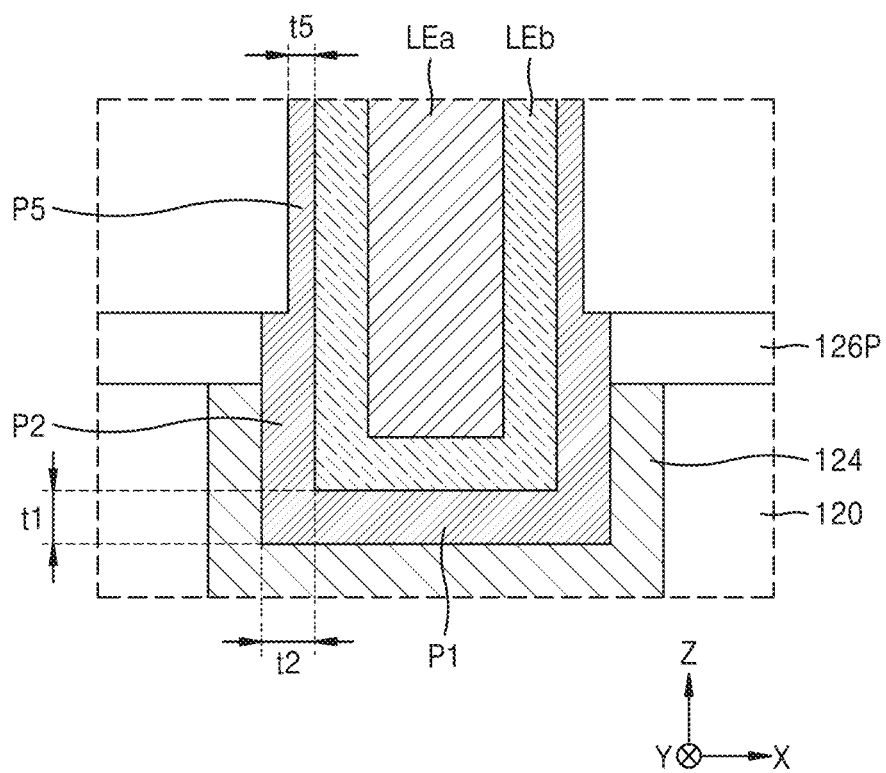
FIG. 10A is an enlarged view of a region Na of FIG. 9.
Figure 10B:
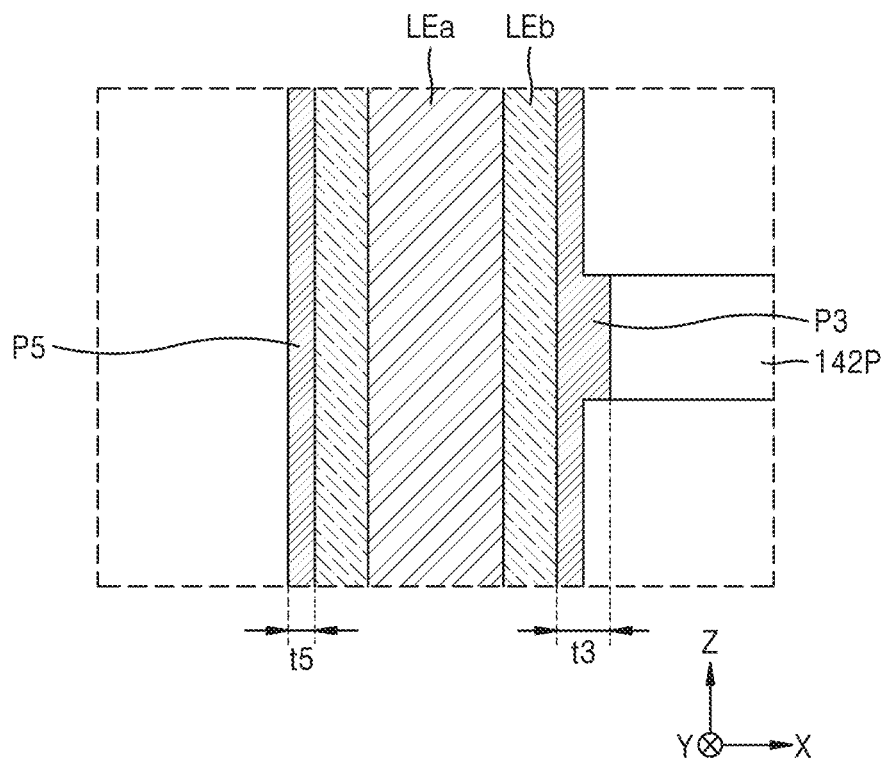
FIG. 10B is an enlarged view of a region Nb of FIG. 9.
Figure 10C:
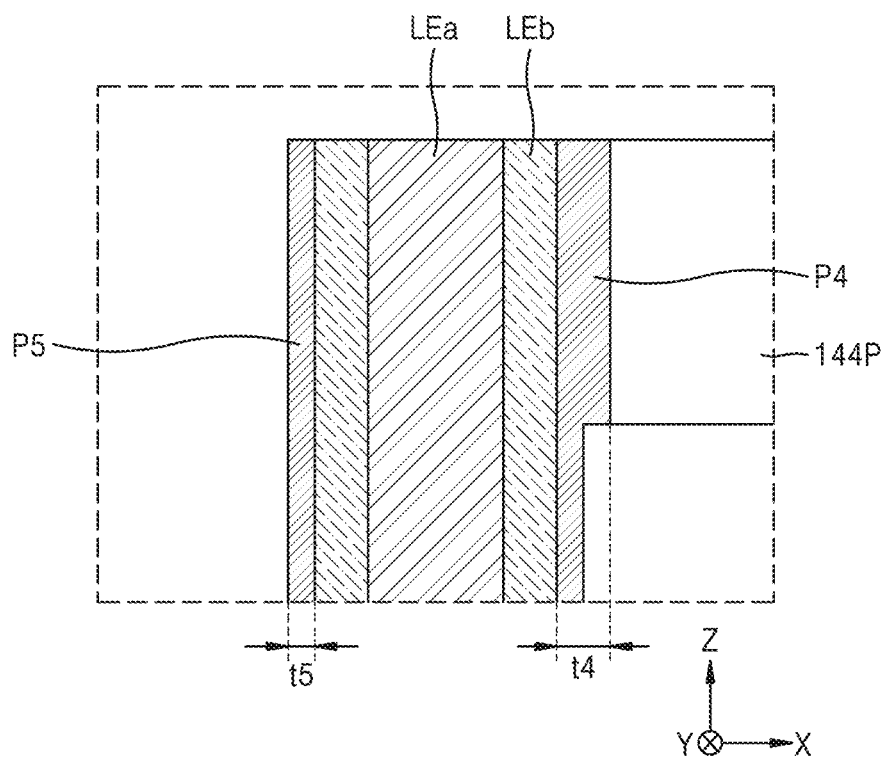
FIG. 10C is an enlarged view of a region Nc of FIG. 9.

FIG. 9 is a cross-sectional view of a method of manufacturing a semiconductor device, according to some example embodiments of the inventive concepts. FIG. 10A is an enlarged view of a region Na of FIG. 9. FIG. 10B is an enlarged view of a region Nb of FIG. 9. FIG. 10C is an enlarged view of a region Nc of FIG. 9. Hereinafter, differences between the method of manufacturing a semiconductor device described above with reference to FIGS. 7A to 7E and 2B and the method of manufacturing a semiconductor device shown in FIG. 9 will be described.

Referring to FIGS. 7D and 9, the surface layer LEc-2 may be partially removed while the first mold pattern 132P and the second mold pattern 134P are being removed. However, even after the first mold pattern 132P and the second mold pattern 134P are removed, the dielectric constant-increasing layer LEb may be covered by the surface layer LEc-2. However, the thickness of the surface layer LEc-2 may not be uniform. In other words, the surface layer LEc-2 may further include the fourth side portion P5 that is in direct contact with the dielectric layer 160 and has a relatively small thickness. In some embodiments, the fourth side portion P5 of the surface layer LEc-2 may extend between the first side portion P3 and the second side portion P4 of the surface layer LEc-2 and the first side portion P3 and the third side portion P2 of the surface layer LEc-2.

As shown in FIG. 10B, the thickness t5 of the fourth side portion P5 of the surface layer LEc-2 in the first horizontal direction (X direction) may be less than a thickness t3 of the first side portion P3 of the surface layer LEc-2 in the first horizontal direction (X direction). As shown in FIG. 10C, the thickness t5 of the fourth side portion P5 of the surface layer LEc-2 in the first horizontal direction (X direction) may be less than a thickness t4 of the second side portion P4 of the surface layer LEc-2 in the first horizontal direction (X direction). As shown in FIG. 10A, the thickness t5 of the fourth side portion P5 of the surface layer LEc-2 in the first horizontal direction (X direction) may be less than a thickness t1 of the bottom portion P1 of the surface layer LEc-2 in the vertical direction (Z direction). As shown in FIG. 10A, the thickness t5 of the fourth side portion P5 of the surface layer LEc-2 in the first horizontal direction (X direction) may be less than a thickness t2 of the third side portion P2 of the surface layer LEc-2 in the first horizontal direction (X direction).

Referring to FIG. 4, the dielectric layer 160 may be formed on the lower electrode LE-2, the first support pattern 142P, and the second support pattern 144P. Next, the upper electrode UE may be formed on the dielectric layer 160. The semiconductor device 100-2 shown in FIG. 4 may be manufactured according to the method described with reference to FIGS. 7D, 9, 10A to 10C, and FIG. 4.

While the inventive concepts have been particularly shown and described with reference to embodiments thereof, it will be understood that various changes in form and details may be made therein without departing from the spirit and scope of the following claims.

What is claimed is:

1. A semiconductor device comprising:
    a lower structure;
    a lower electrode on the lower structure;
    an upper electrode; and
    a dielectric layer between the lower electrode and the upper electrode,
    wherein the lower electrode comprises a bending reducing layer and a dielectric constant-increasing layer between the bending reducing layer and the dielectric layer,
    an upper surface of the bending reducing layer and an upper surface of the dielectric constant-increasing layer are substantially co-planar,
    the dielectric constant-increasing layer is configured to increase a dielectric constant of the dielectric layer, and
    an elastic modulus of the bending reducing layer is greater than an elastic modulus of the dielectric constant-increasing layer.

2. The semiconductor device of claim 1, wherein the bending reducing layer has a pillar shape.

3. The semiconductor device of claim 2, wherein the dielectric constant-increasing layer is on side surfaces of the bending reducing layer.

4. The semiconductor device of claim 3, wherein the dielectric constant-increasing layer extends between a bottom of the bending reducing layer and the lower structure.

5. The semiconductor device of claim 1, wherein the bending reducing layer comprises titanium (Ti), nitrogen (N), and X1, and
    X1 is at least one element other than Ti and N.

6. The semiconductor device of claim 5, wherein X1 comprises at least one of silicon (Si), tungsten (W), carbon (C), or aluminum (Al).

7. The semiconductor device of claim 1, wherein the dielectric constant-increasing layer comprises X2 and X3,
    X2 comprises at least one of molybdenum (Mo), tantalum (Ta), ruthenium (Ru), or niobium (Nb), and
    X3 comprises at least one of nitrogen (N) or oxygen (O).

8. The semiconductor device of claim 1, wherein the dielectric layer comprises at least one of hafnium oxide or zirconium oxide.

9. The semiconductor device of claim 1, wherein the lower electrode further comprises a surface layer between the dielectric constant-increasing layer and the dielectric layer.

10. The semiconductor device of claim 9, wherein the surface layer comprises titanium nitride (TiN).

11. A semiconductor device comprising:
    a lower structure;
    a lower electrode, comprising a surface layer on the lower structure, a bending reducing layer, and a dielectric constant-increasing layer between the surface layer and the bending reducing layer;
    a support pattern contacting side surfaces of the lower electrode and supporting the lower electrode;
    a dielectric layer on the lower electrode and the support pattern; and
    an upper electrode on the dielectric layer,
    wherein at least a portion of the dielectric constant-increasing layer is in direct contact with the dielectric layer, and
    wherein an upper surface of the bending reducing layer and an upper surface of the dielectric constant-increasing layer are substantially co-planar.

12. The semiconductor device of claim 11, wherein the surface layer comprises titanium nitride (TiN), the dielectric constant-increasing layer comprises niobium nitride (NbN), and the bending reducing layer comprises titanium silicide nitride (TiSiN).

13. The semiconductor device of claim 11, wherein the surface layer comprises a side portion between the support pattern and the dielectric constant-increasing layer.

14. The semiconductor device of claim 11, wherein the surface layer comprises a bottom portion between the lower structure and a bottom of the dielectric constant-increasing layer.

15. The semiconductor device of claim 11, wherein the surface layer comprises a side portion between the lower structure and a side surface of the dielectric constant-increasing layer.

16. A semiconductor device comprising:
a lower structure;
a lower electrode, comprising a surface layer on the lower structure, a bending reducing layer, and a dielectric constant-increasing layer between the surface layer and the bending reducing layer;
a support pattern contacting side surfaces of the lower electrode and supporting the lower electrode;
a dielectric layer on the lower electrode and the support pattern; and
an upper electrode on the dielectric layer,
wherein the bending reducing layer has a pillar shape extending in a vertical direction,
an upper surface of the bending reducing layer and an upper surface of the dielectric constant-increasing layer are substantially co-planar,
the surface layer comprises a first side portion in direct contact with the support pattern and a second side portion in direct contact with the dielectric layer, and
a thickness of the second side portion of the surface layer in a horizontal direction perpendicular to the vertical direction is less than a thickness of the first side portion of the surface layer.

17. The semiconductor device of claim 16, wherein the surface layer comprises a bottom portion between the lower structure and a bottom of the dielectric constant-increasing layer, and
the thickness of the second side portion of the surface layer in the horizontal direction is less than a thickness of the bottom portion of the surface layer in the vertical direction.

18. The semiconductor device of claim 16, wherein the surface layer comprises a third side portion between the lower structure and a side surface of the dielectric constant-increasing layer, and
the thickness of the second side portion of the surface layer in the horizontal direction is less than a thickness of the third side portion of the surface layer in the horizontal direction.

19. The semiconductor device of claim 16, wherein the dielectric constant-increasing layer is configured to increase a dielectric constant of the dielectric layer.

20. The semiconductor device of claim 16, wherein an elastic modulus of the bending reducing layer is greater than an elastic modulus of the surface layer and an elastic modulus of the dielectric constant-increasing layer.

* * * * *